United States Patent [19]

Harigane et al.

[11] 4,196,513
[45] Apr. 8, 1980

[54] MACHINE FOR AUTOMATICALLY INSERTING PARALLEL LEAD ELECTRONIC COMPONENTS INTO A PRINTED CIRCUIT BOARD

[75] Inventors: Kotaro Harigane; Hiroyuki Ohira, both of Tokyo, Japan

[73] Assignee: Tokyo Denki Kagaku Kogyo Kabushiki Kaisha, Tokyo, Japan

[21] Appl. No.: 890,151

[22] Filed: Mar. 27, 1978

[30] Foreign Application Priority Data

May 26, 1977 [JP] Japan .................................. 52-60493
Jun. 8, 1977 [JP] Japan .............................. 52-73686[U]

[51] Int. Cl.² ......................... H05K 3/32; H05K 13/02
[52] U.S. Cl. ......................................... 29/741; 29/837
[58] Field of Search .................. 29/741, 739, 759, 626

[56] References Cited

U.S. PATENT DOCUMENTS

| 3,594,889 | 7/1971 | Clark ................................. 29/741 X |
| 4,054,988 | 10/1977 | Masuzima et al. ................. 29/741 X |

*Primary Examiner*—Carl E. Hall

*Attorney, Agent, or Firm*—Blum, Kaplan, Friedman, Silberman & Beran

[57] ABSTRACT

A machine for processing and securing parallel lead electronic components into lead receiving openings formed in a printed circuit board having an improved insert assembly is provided. The machine includes a supply assembly for selectively supplying a parallel lead electronic component to be inserted. A transfer assembly including a plurality of chuck assemblies disposed around a rotary disc for supplying the selected electronic component and displacing the supplied electronic component to a release position. An insert assembly including a holding and guiding sub-assembly for receiving the selected electronic component from the chuck at the release position and a push bar sub-assembly adapted to engage the electronic component at the release position and displace the electronic component to an inserted position in the printed circuit board. A table assembly for positioning the receiving openings in the board into alignment with the parallel leads of the electronic component in the insert position such that each electronic component is received in the appropriate receiving openings.

12 Claims, 47 Drawing Figures

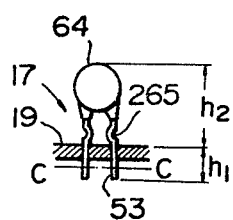
FIG. 6
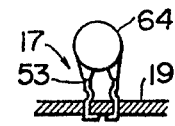
FIG. 7
FIG. 8
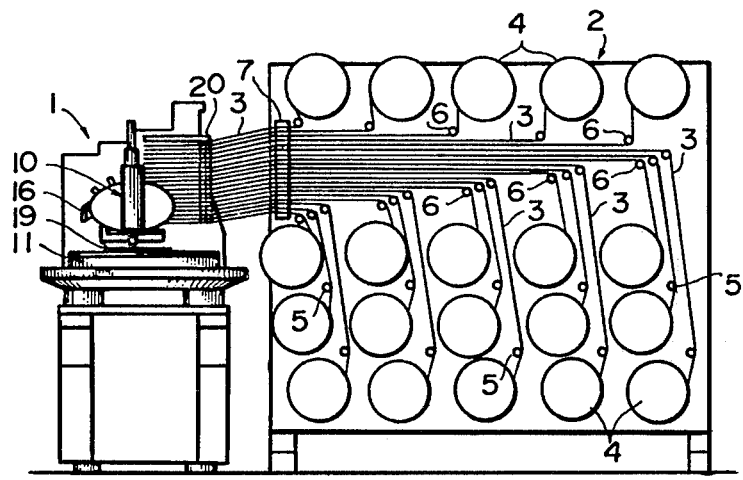
FIG. 9
PRIOR ART
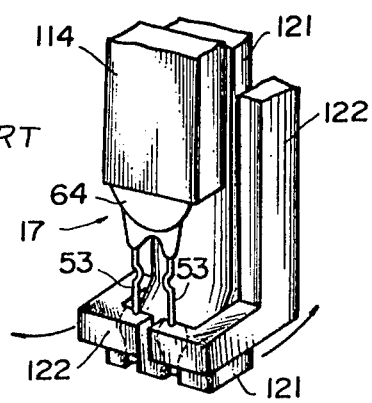

MACHINE FOR AUTOMATICALLY INSERTING PARALLEL LEAD ELECTRONIC COMPONENTS INTO A PRINTED CIRCUIT BOARD

BACKGROUND OF THE INVENTION

This invention relates to a machine for selecting and securing parallel lead electronic components to a printed circuit board, and in particular to an improved machine for automatically securing the electronic components to a printed circuit board in an improved manner.

Machines specifically designed for processing and securing parallel lead electronic components to printed circuit boards have been provided. One such machine is described and claimed in prior co-pending U.S. Patent application Ser. No. 672,944, now U.S. Pat. No. 4,054,988, issued on Oct. 25, 1977. The machine includes a supply assembly for supplying a selected parallel lead electronic component and includes a selection sub-assembly for selecting one of the electronic components from the selected group of electronic components to be inserted. A transfer assembly is provided for receiving a selected electronic component and for transferring the electronic component to a release position. The transfer assembly includes a plurality of chucks disposed about a rotary disc for gripping the selected electronic component and positioning it in the release position. A described insert assembly includes a chuck releasing mechanism for opening the chucks to release the selected electronic component gripped therein when the chuck is positioned in the release position. The insert assembly further includes a holding and guiding sub-assembly for receiving the selected electronic component released by the chuck at the release position. An upper slide sub-assembly and a lower slide sub-assembly engaged with a pressing head for inserting the leads of the electronic component into the circuit board is also included in the inserting assembly. A table assembly is provided for positioning the receiving openings in the printed circuit board into alignment with the selected electronic component in the release position so that the parallel leads of the electronic component are received in the receiving opening when the electronic component is inserted into the printed circuit board.

The parallel lead electronic component is inserted into a printed circuit board by a push bar moving downwardly towards the circuit board. When the leads of the electronic component have been inserted into receiving openings in the printed circuit board, a lead guide and lead holder are displaced in opposite directions from a plane drawn through the parallel leads and the insert assembly is moved away from the electronic component and circuit board. This inserting operation has been satisfactory for some inserting operations. However, when inserting a large number of electronic components at high speed within a limited area of a printed circuit board the machine has proved to be less than completely satisfactory. For example, a problem arises when it is necessary to minimize the distance between inserted electronic components due to the distance required to displace the lead guide and lead holder member after inserting the component. Furthermore, when the lead guide and lead press are displaced away from the printed circuit board, they may impinge on the inserted electronic circuit element when inserting electronic components at high speed.

An additional shortcoming of the machine described in the co-pending application is that it is only suitable for inserting circuit elements having a flat shape and a narrow thickness, such as ceramic condensers and the like. Accordingly, it would be desirable to have an improved machine for automatically inserting parallel lead electronic components to printed circuit boards at high speeds wherein a variety of different types of electronic elements may be inserted at relatively close distances to each other.

SUMMARY OF THE INVENTION

Generally speaking, in accordance with the invention an automatic machine for inserting parallel lead electronic components into lead receiving openings formed in a printed circuit substrate having an improved insert mechanism is provided. The improved insert assembly includes a frame having a substantially vertical axis, first slider means driven in a vertical direction by driving means mounted on the frame, second slider means adapted to move vertically in response to movement of the first slider means, lead holding and guiding means for holding and guiding the parallel leads of the electronic components, the lead holding and guiding means adapted to move vertically in response to movement of the second slider means, the lead holding and guiding means including two outer holding and guiding members and two inner holding and guiding members adapted to engage cooperatively and grip the parallel leads therebetween at a predetermined position, and push bar means adapted to move vertically in response to movement of the first slider means and adapted to engage with the electronic element of the electronic component which is gripped by the lead holding and guiding means and displace the electronic component from the predetermined position to an inserted position while the electronic component is gripped by the lead holding and guiding means.

Accordingly, it is an object of the invention to provide an improved automatic machine for inserting parallel lead electronic components into printed circuit boards.

Another object of the invention is to provide a machine for inserting parallel lead electronic components into a printed circuit board which includes an improved insert assembly permitting insertion of electronic components close to an adjacent inserted component at a distance which is not limited by the size of the inserting mechanism.

A further object of the invention is to provide a machine for automatically inserting parallel lead electronic components into a printed circuit board which includes an improved insert mechanism to permit automatic insertion of electronic elements differing in size and shape.

Still another object of the invention is to provide a machine for automatically inserting parallel lead electronic components into printed circuit boards, irrespective of the size of the electronic elements and without damage due to excessive force imposed thereon during attachment.

Another object of the invention is to provide a machine for automatically inserting parallel lead electronic components into printed circuit boards which includes an improved insert assembly wherein the insertion density of the electronic components is increased.

Still other objects and advantages of the invention will be part be obvious and will in part be apparent from the specification.

The invention accordingly comprises the features of construction, combination of elements, and arrangement of parts which will be exemplified in the claims.

BRIEF DESCRIPTION OF THE DRAWINGS

For a fuller understanding of the invention, reference is had to the following description taken in connection with the accompanying drawings, in which:

FIG. 6 is a plan view of an electronic component removed from the web carrier and inserted into a printed circuit board, shown in section;

FIG. 7 is a plan view of an electronic component secured to a printed circuit board, shown in section, by a machine constructed in accordance with the invention;

FIG. 8 is an elevational view of an automatic machine for selecting and securing parallel lead electronic components to a printed circuit board constructed in accordance with an embodiment of the invention;

FIG. 9 is a perspective view illustrating a conventional electronic component holding and guiding sub-assembly;

DESCRIPTION OF THE PREFERRED EMBODIMENTS

Figure 1:
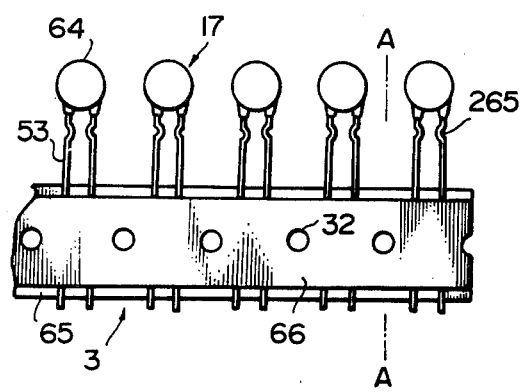
FIG. 1 is a plan view of an electronic component web carrier utilized in the machine of the invention.
Figure 2:
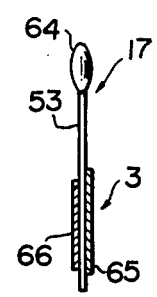
FIG. 2 is an elevational end view of an electronic component of the web carrier in FIG. 1.

In FIGS. 1 and 2, an electronic component web carrier shown utilized in the automatic inserting machine of the invention is shown generally as 3. Web carrier 3 is formed by securing a plurality of parallel lead electronic components shown generally as 17 on a long support band 65 by an adhesive tape 66. Electronic components 17 are positioned on support band 65 equidistantly from each other and transport holes 32 are formed through support band 65 and tape 66 at the transverse midpoint of support band 65 and mid-way between adjacent electronic components 17. A continuous length of web carrier 3 is wound on a reel 4, as shown in FIG. 8. A plurality of reels 4 are mounted on shafts extending outwardly from a holding plate 2 and web carriers 3 are taken out from respective reels 4 and guided into an automatic inserting machine shown generally as 1.

Inserting machine 1 and reel holding plate 2 are arranged in parallel to each other and are automatically operated according to a predetermined program by an NC control apparatus (not shown) separately disposed from inserting machine 1. The electronic components wound on the respective reels may be different in kind. For example, they may be condensers or resistors, or condensers of different capacity. Web carriers 3 unwound from respective reels 4 are held horizontally and in parallel to each other through a guide roller 5 and feed roller 6 and are introduced into inserting machine 1 through a guide 7.

Figure 13:
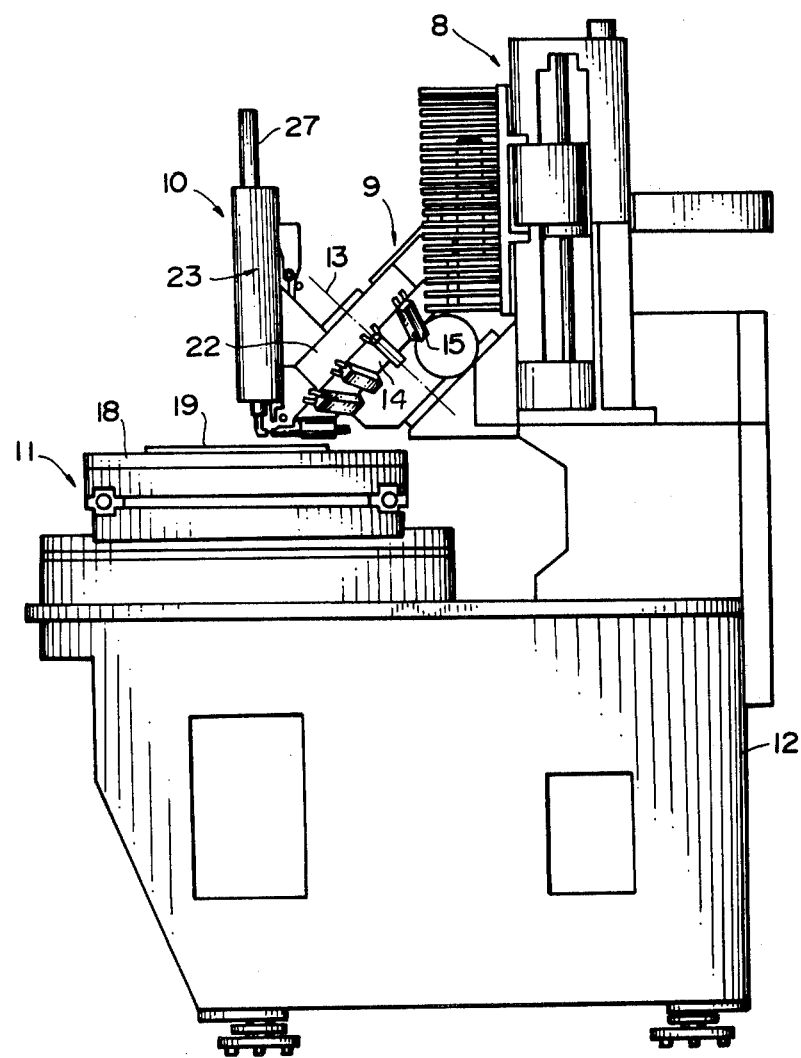
FIG. 13 is a side elevational view of the machine shown in FIG. 8.

Referring specifically to FIGS. 8 and 13, an automatic inserting machine constructed and arranged in accordance with the invention is shown generally as 1, including a supply assembly shown generally as 8, a transfer assembly shown generally as 9, an insert assembly shown generally as 10 and a table assembly shown generally as 11. Each of these assemblies is supported on a frame 12. The operation of the respective supply, transfer, insert and table assembly is briefly described with particular reference to the improved insert assembly which will be described in greater detail.

Figure 3:
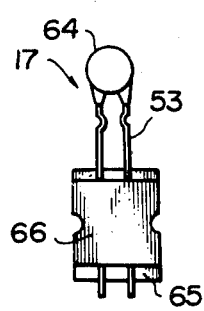
FIG. 3 is a plan view of a separated portion of the electronic component web carrier illustrated in FIG. 1.
Figure 4:
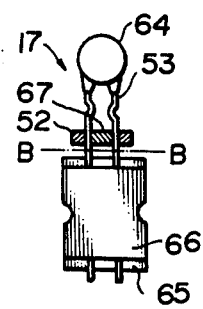
FIG. 4 is a plan view of a portion of the electronic component web carrier being gripped by a chuck, illustrated in section.
Figure 5:
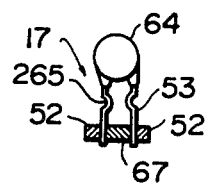
FIG. 5 is a plan view of an electronic component after removal of the web carrier tape therefrom, the component being gripped by a chuck.

Each of the respective electronic component web carriers 3 are supplied to supply assembly 8. The particular tape supply is selected by the NC program and applied to cutter sub-assembly 16 which cuts the specific tape along Line A—A illustrated in FIG. 1 to separate each electronic component 17 and a portion of web carrier 3 carrying the component as illustrated in FIG. 3. After cutting the tape portion and associated electronic component at cutting assembly 16, parallel leads 53 of electronic component 17 are gripped by one of a plurality of chucks 15 provided on the periphery of a rotary chuck holder 14 mounted at an angle of 45° with respect to the horizontal plane. During transfer of electronic component 17 by transfer assembly 9, leads 53 of electronic component 17 are cut along line B—B as illustrated in FIG. 4 to yield electronic component 17 in the form illustrated in FIG. 5. Thereafter electronic component 17 is transferred in an upright position at insert assembly 10.

At the insert assembly position, the separated electronic component 17 is received by the insert assembly and released by the transfer assemby, whereafter electronic component 17 is urged into and through openings in printed circuit board 19 by insert assembly 10. As is detailed below, insert assembly 10 includes several sub-assemblies slideably mounted on frame 23 and may include a rotary head sub-assembly for turning electronic component 17 90° about its vertical axis when desired.

Printed circuit board 19 into which each electronic component 17 is to be secured, is positioned on table 18 mounted on table assembly 11. Table 18 is displaced coordinately in the X and Y direction in a horizontal plane in accordance with programed instructions from the NC program to bring lead receiving openings 19' into alignment with insert assembly 10 and leads 53. Once parallel leads 53 are inserted through receiving openings 19', excess portions of leads 53 extending through substrate 19 are cut and bent at right angles in the manner illustrated in FIG. 7 to secure electronic component 17 to substrate 19.

Figure 10:
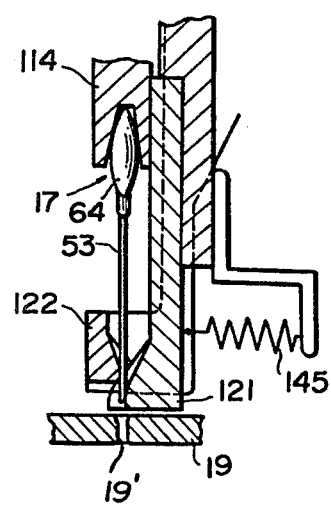
FIG. 10 is a sectional view of the electronic component holding assembly illustrated in FIG. 9.
Figure 11A:
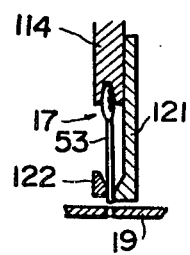
FIGS. 11a, 11b and 11c are sectional views illustrating the sequence of steps wherein the electronic component is being inserted into receiving openings in a printed circuit board by the holding and guiding sub-assembly illustrated in FIG. 9.
Figure 11B:
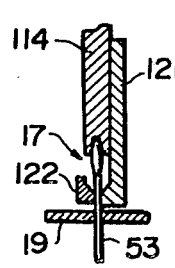

Referring now to FIGS. 9 and 10, the lead holding and guiding sub-assembly of an insert assembly of the machine described in the co-pending application is shown. This sub-assembly includes a lead guide 121 and a lead press 122 which are supported in the insert assembly so that they may be opened and closed with respect to each other. Electronic component 17 is inserted into printed circuit board 19 as follows. Leads 53 of electronic component 17 are held by lead guide 121 and lead press 122 of insert assembly 10 and electronic component 64 is pressed towards printed circuit board 19 by a downwardly moving push bar 114. When performing the inserting operation, insert assembly 10 is displaced proximate to board 19 as shown in FIG. 11a, and a lead receiving opening 19' is positioned below lead 53 by movement of table assembly 11 which is regulated by the NC program. Push bar 114 is displaced downwardly and electronic component 17 is inserted into printed circuit board 19 as shown in FIG. 11b. A portion of lead 53 projecting on the back face of printed circuit board 19 is cut by a lead cutting and bending assembly (not shown) which operates on the back side of printed circuit board 19. The remaining portion of lead 53 is bent by the cutting and bending assembly to secure electronic component 17 to printed circuit board 19 as shown in FIG. 7.

Figure 11C:
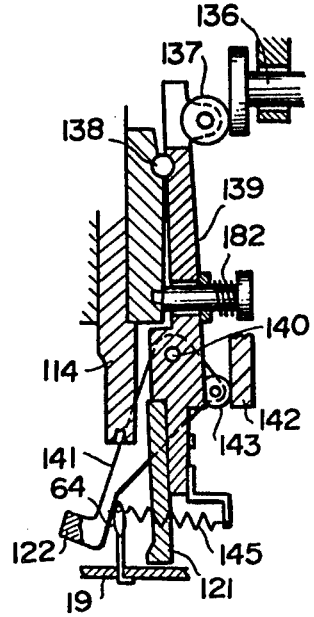

After electronic component 17 has been secured, lead guide 121 and lead press 122 are retracted from electronic component 17 as shown in FIG. 11c. Lead guide 121 is displaced by movement of a fixing pin 136 which abuts a roller 137 secured to a lever 139 which pivots about a fulcrum pin 138 thereby biasing lever 139 against spring 182. Lead press 122 is displaced by a fixing plate 142 which abuts a roller 143 mounted on a lever 141 which pivots about a fulcrum pin 140 thereby biasing lead press 122 against a spring 145. When lead guide 121 and lead press 122 are retracted from leads 53 to define an open position the entire insert assembly can be retracted in the upward direction to the initial receiving position so as to clear completely electronic element 64 during the upward stroke.

Figure 12:
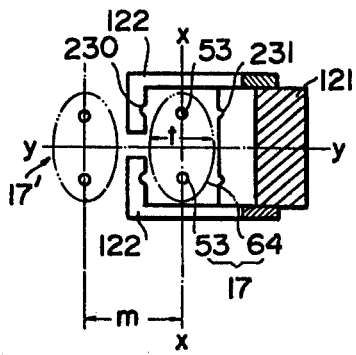
FIG. 12 is a sectional view illustrating the position of the holding and guiding sub-assembly illustrated in FIG. 11(c)

The position of lead guide 121 and lead press 122 in the retracted state is shown in plan view in FIG. 12. Leads 53 of electronic component 17 were gripped and held in the Y direction by grooves 230 formed in lead press 122 and grooves 231 formed in lead guide 121. In order to release leads 53 and prevent lead guide 121 and lead press 122 from impinging against electronic element 64, lead guide 121 and lead press 122 are retracted and opened in opposite directions in the Y direction to the retracted position shown in FIG. 12. In order to attach several electronic components 17 at a high density on a limited area of printed circuit board 19, it is necessary to minimize the distance m between electronic component 17 and an adjacent previously inserted electronic component 17'. However, since lead press 122 is interposed between adjacent components 17 and 17' and surrounds the periphery of electronic component 17, the shape of an electronic element which may be inserted by insert assembly 10 is limited. For example, electronic element 64 is limited to a flat shape having a short thickness t, thereby limiting the type and size of electronic elements which may be inserted to ceramic condensers and the like. A detailed description of the foregoing is set forth in co-pending U.S. patent application Ser. No. 672,944.

Figure 14:
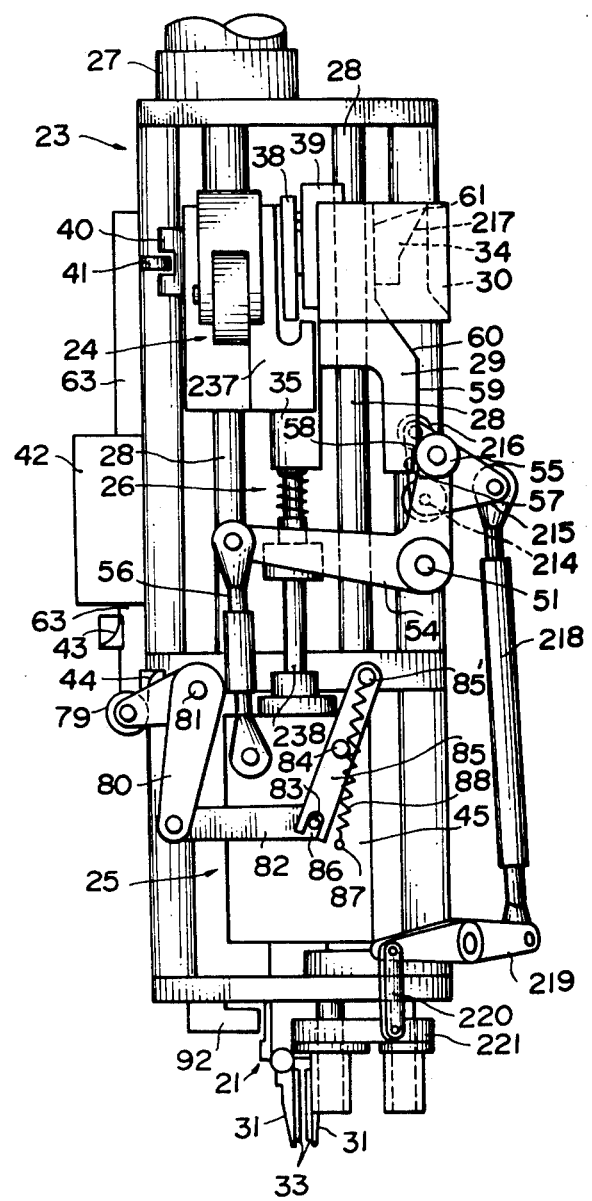
FIG. 14 is a front elevational view of a preferred embodiment of an insert assembly utilized in the machine of FIGS. 8 and 13.
Figure 15:
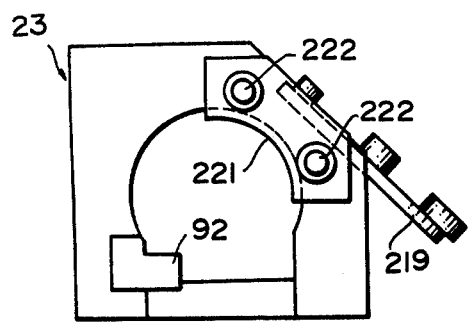
FIG. 15 is a bottom view of the insert assembly illustrated in FIG. 14.
Figure 16:
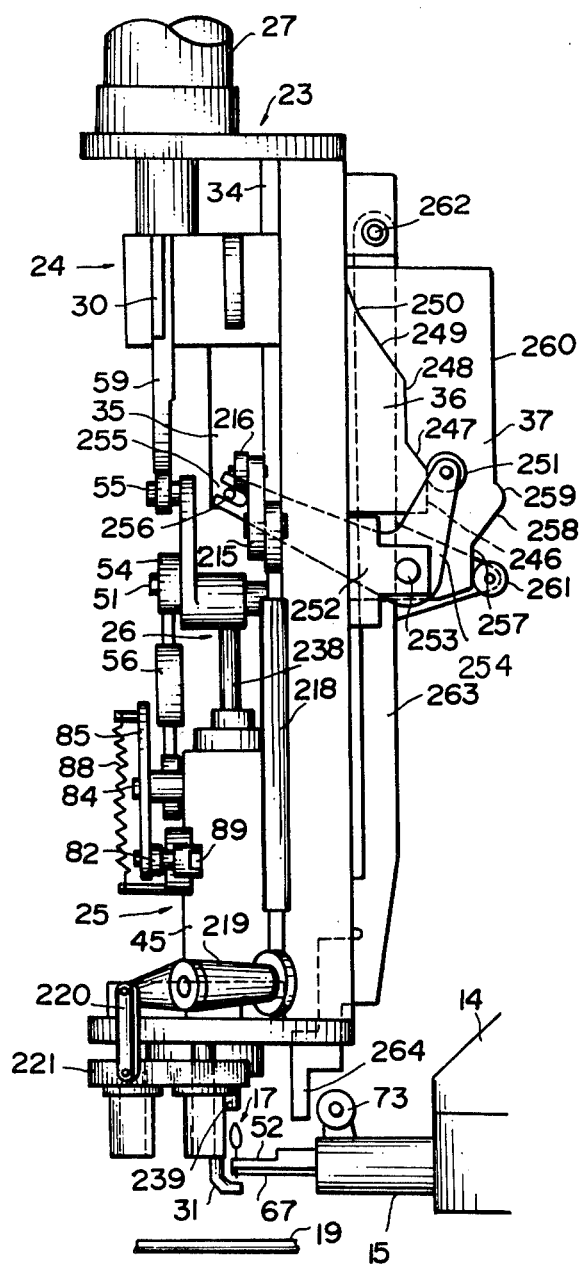
FIG. 16 is a side elevational view of the insert assembly illustrated in FIG. 14.

Referring now to FIGS. 14–16, one embodiment of insert assembly 10 constructed and arranged in accordance with the invention is shown. Insert assembly 10 comprises frame 23 attached to a stand 22 which is secured to frame 12 and includes an upper slider sub-assembly 24 and a lower slider sub-assembly 25 each supported independently and mounted slideably on frame 23, a lead holding and guiding sub-assembly 21 supported on lower slider sub-assembly 25 mounted rotatably about a vertical shaft thereof, and a push bar sub-assembly 26 supported by upper slider sub-assembly 24 and lead holding and guiding sub-assembly 21. Each sub-assembly of the improved insert assembly will be discussed in detail below.

Figure 17:
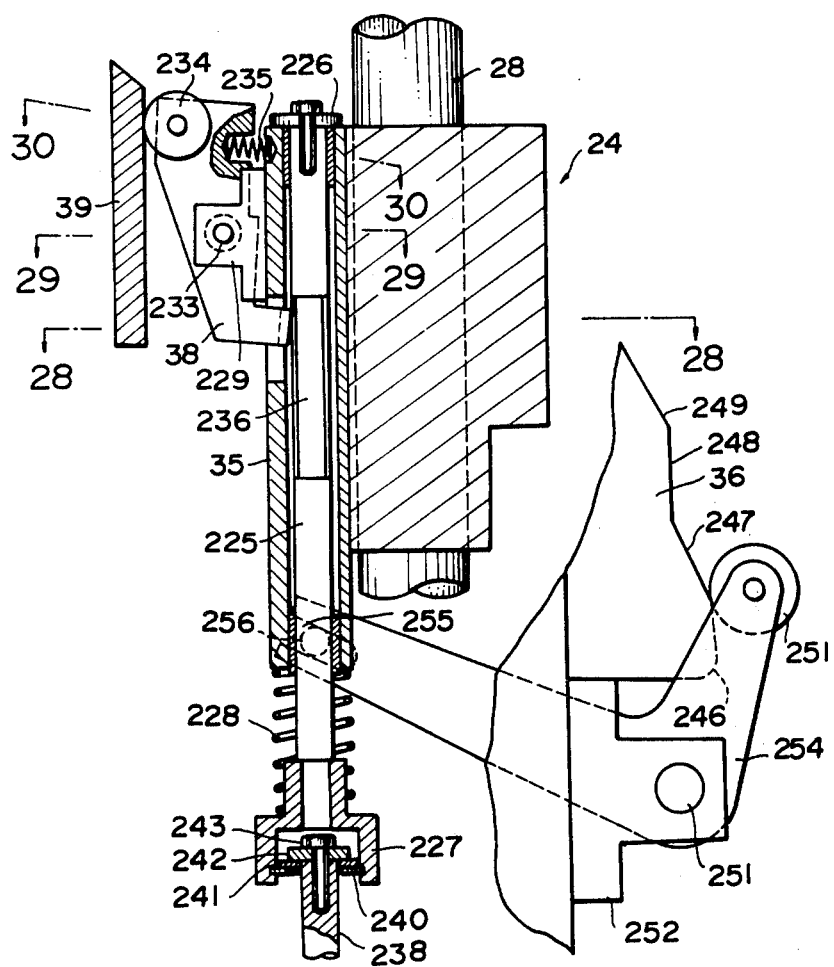
FIG. 17 is a sectional view of a sleeve and surrounding portion thereof of a portion of the insert assembly illustrated in FIG. 14.

Upper slider sub-assembly 24 is supported slideably along a vertical guide rod 28 mounted on frame 23. A cylinder 27 actuated by the NC program causes upper slider sub-assembly 24 to move vertically along guide rod 28. Several cam members are supported on upper slider sub-assembly 24 as follows. Two lower slider cams 29 and 30 are adapted to determine movement of lower slider sub-assembly 25. An opening and closing cam 34 is adapted to open and close two outer holding and guiding members 31 and two inner holding and guiding members of lead holding and guiding sub-assembly 21. A sleeve cam 36 is adapted to regulate movement of a sleeve 35 which forms a part of push bar sub-assembly 26. A chuck cam 37 is adapted to open and close chucks 15. A cam clamp 39 is adapted to regulate movement of a clamp 38 for clamping push bar sub-assembly 236 as shown in FIG. 17. In addition, lead holding and guiding sub-assembly rotating cams 43 and 44 adapted to rotate lead holding and guiding sub-assembly 21 are mounted on a block 42 which is slideably mounted on frame 23 so as to move together with upper slider sub-assembly 24 by a projection 41 secured to a guide 40 mounted on upper slider sub-assembly 24 as shown in FIG. 14.

Figure 19:
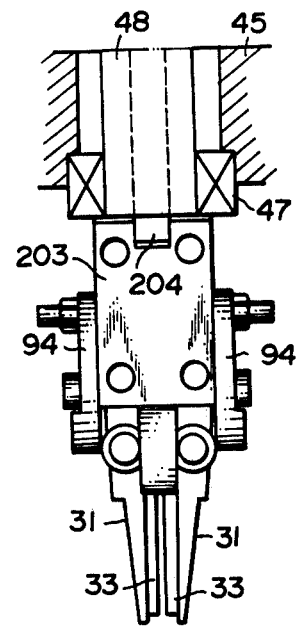
FIG. 19 is a front elevational view of the lower slider sub-assembly shown in FIG. 18.
Figure 20:
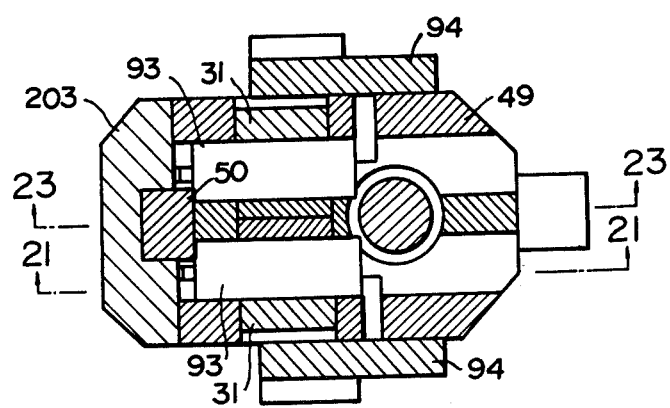
FIG. 20 is a sectional view illustrating a portion of a lead holding and guiding sub-assembly constructed in accordance with a preferred embodiment of the invention and taken along Line 20-20 of FIG. 21.
Figure 18:
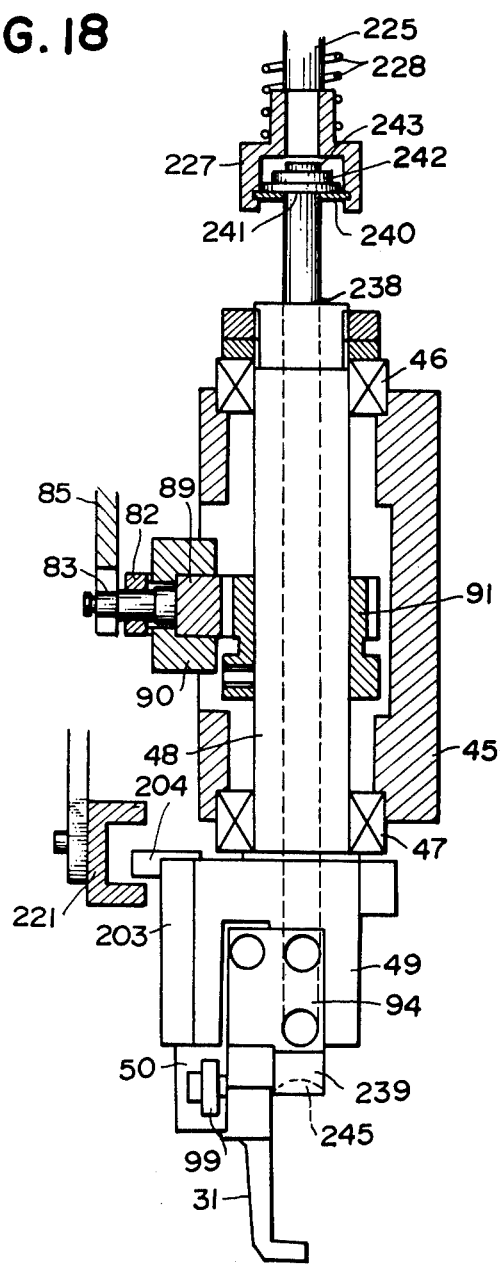
FIG. 18 is a sectional view of a lower slider sub-assembly of the insert assembly illustrated in FIG. 14.
Figure 21:
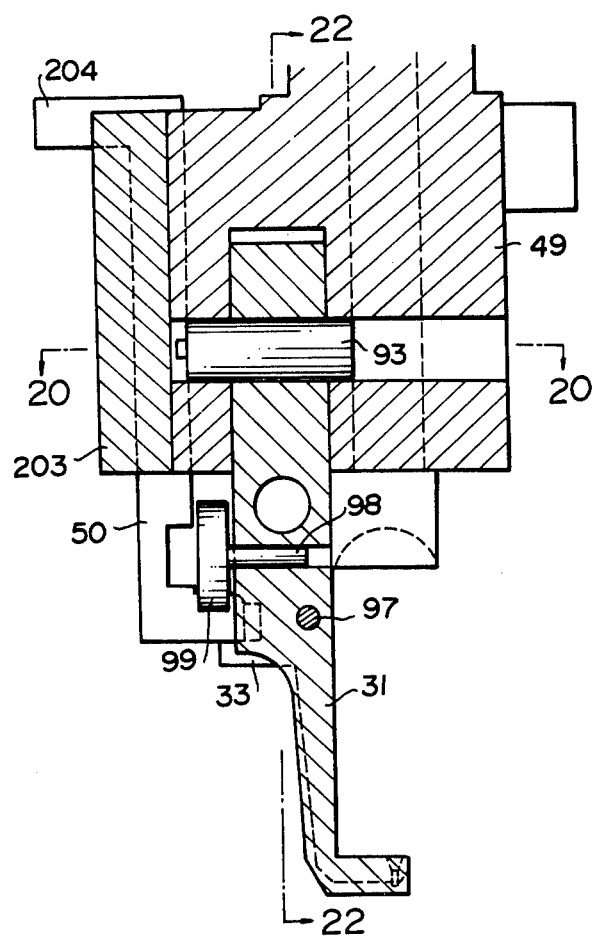
FIG. 21 is a sectional view of the lead holding and guiding sub-assembly illustrated in FIG. 20 and taken along Line 21—21 of FIG. 20.
Figure 22:
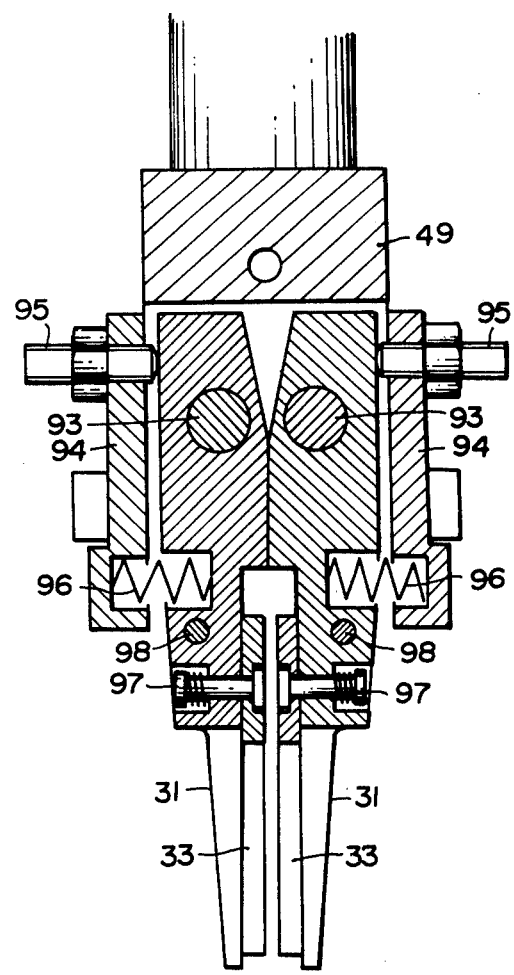
FIG. 22 is a sectional view of the lead holding and guiding sub-assembly taken along Line 22—22 in FIG. 21.

Lower slider sub-assembly 25 is supported by and pivots on frame 23 so that a body 45, shown in FIGS. 14, 16, 18 and 19, slides in the vertical direction with respect to frame 23. As shown in FIGS. 18 and 19, lead holding and guiding sub-assembly 21 is supported rotatably in body 45 at the position of a rotary sleeve 48 by bearings 46 and 47. A block 49 is mounted on the lower end of rotary sleeve 48 for anchoring outer and inner holding and guiding members 31 and 33 for holding electronic component 17 by leads 53. An operation rod 50 for actuating movement of outer and inner holding and guiding members 31 and 33 is mounted slideably on block 49 so as to move in the vertical direction.

Referring now to FIG. 14, lower slider sub-assembly 25 is displaced in the vertical direction by a roller 55 mounted rotatably on the upper end of a bell crank 54 pivotally attached to frame 23 by a pin 51. The lower end of bell crank 54 is attached pivotally to lower slider sub-assembly 25 by a connecting rod 56. Lower slider cam 29 is moved in the vertical direction by movement of upper slider sub-assembly 24 thereby roller 55 engages lower slider cam 29 displacing bell crank 54 in the clockwise direction and lower slider sub-assembly 25 is raised by action of connecting rod 56.

Cam 29 is formed with a short vertical surface 57, an inclined convex surface 58, a long vertical surface 59 extending vertically, a gradually concaved inclined face 60 and upper vertical surface 61, respectively, extending upwardly from the lower end of cam 29. Accordingly, when roller 55 travels along inclined surface 60 towards the center of frame 23, lower slider sub-assembly 25 is lowered. Body 45 of lower slider sub-assembly 25 impinges on a stopper 92 mounted on the lower end of frame 23 prior to roller 55 falling in contact with flat portion 61. Lower slider cam 30 is mounted on upper slider sub-assembly 24 and prevents lower slider sub-assembly 25 from springing up by a repulsive force when it impinges on stopper 92.

A mechanism for rotating rotary sleeve 48, shown in FIG. 18, will be described by reference to FIG. 14. Block 42 is mounted on upper slider sub-assembly by bar 63 so that it may move horizontally with respect to the axis of frame 23. When block 42 is displaced in the counterclockwise direction, a roller 79 mounted on the upper arm of bell crank 80 engages with lead holding and guiding sub-assembly rotating cams 43 and 44. A bar 63 is supported slideably in block 42 so it can slide vertically in block 42. Lead holding and guiding sub-assembly rotating cams 43 and 44 are mounted on the lower end of bar 63. When block 42 is displaced in the clockwise direction with respect to the axis of frame 23, roller 79 does not engage lead holding and guiding sub-assembly rotating cams 43 and 44. FIG. 14 illustrates the relative position of the elements wherein roller 79 is displaced away from the axis of frame 23 by lead holding and guiding sub-assembly rotating cam 44. As bar 63 is lowered relative to lower slider sub-assembly 25, lead holding and guiding sub-assembly rotating cam 43 abuts roller 79 to displace roller 79 downwardly in the counterclockwise direction.

Bell crank 80 is mounted pivotally to lower slider sub-assembly 25 by a pin 81. The lower arm of bell crank 80 is connected pivotally to a connecting rod 82 which is mounted rotatably to body 45 of lower slider sub-assembly 25 by a pin 83. A lever 85 formed with a U-shaped groove 86 at its lower end is engaged with pin 83 and mounted pivotally on block 45 by a pin 84. A spring 88 secured to block 45 by a pin 87 is attached to the upper end of lever 85 by a pin 85'. As depicted in FIG. 18, pin 83 is secured to a rack 89 which is mounted slideably in the horizontal direction by a guide 90 mounted on body 45 so as to rotate a pinion 91 engaged with pin 83 and turn rotary sleeve 48.

Referring now to FIGS. 20–24, lead holding and guiding sub-assembly 21 for holding electronic components 17 will now be described in detail. Two outer holding and guiding members 31 are mounted pivotally to block 49 by a pin 93 and a press 94 mounted on each side of block 49. Each press 94 includes a stopper bolt 95 for defining the closed position of outer holding and guiding member 31. A spring 96 biased between outer holding and guiding member 31 and press 94. Each inner holding and guiding member 33 is mounted rotatably on its respective outer holding and guiding member 31 by a pin 97 and a roller 99 mounted on the respective outer holding and guiding member 31 by a pin 98.

Figure 25:
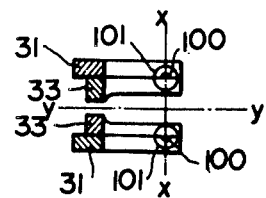
FIG. 25 is a sectional view of the lead holding and guiding sub-assembly taken along Line 25—25 in FIG. 23.
Figure 26:
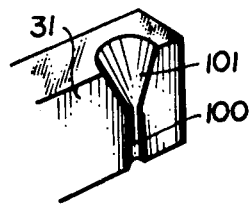
FIG. 26 is a perspective view of a portion of an outer lead holding and guiding member of the lead holding and guiding sub-assembly illustrated in FIGS. 19-25.
Figure 27:
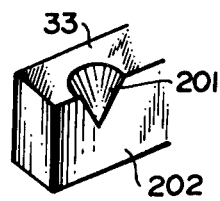
FIG. 27 is a perspective view of a portion of an inner load holding and guiding member of the lead holding and guiding sub-assembly illustrated in FIGS. 19-25.

The holding portion of outer holding and guiding members 31 are formed with an L-shaped bend having a horizontal portion. The horizontal portion is formed with a holding groove 100 extending from the bottom of the horizontal portion to a conical face guiding groove 101 at the top of the horizontal portion as shown in FIG. 26. The top portion of inner holding and guiding member 33 is formed with an L-shaped bend having a horizontal holding portion. The horizontal portion is formed with a conical face guide groove 201 in the upper part thereof facing outwardly to cooperate with holding groove 100 as shown in FIG. 25 and a flat face 202 formed on the lower surface thereof.

When lead 53 is inserted into lead holding and guiding sub-assembly 21 from above, it is guided by guide grooves 101 and 201 and introduced into holding grooves 100. Thus, lead 53 is held and gripped by lead holding and guiding members 31 and 33 by action of holding grooves 100 and flat surfaces 202. Accordingly, by constructing and arranging lead holding and guiding sub-assembly in the manner described, it is possible to displace inner holding and guiding members 33 in the Y direction with respect to outer holding and guiding member 31 while lead 53 remains gripped therein.

Figure 23:
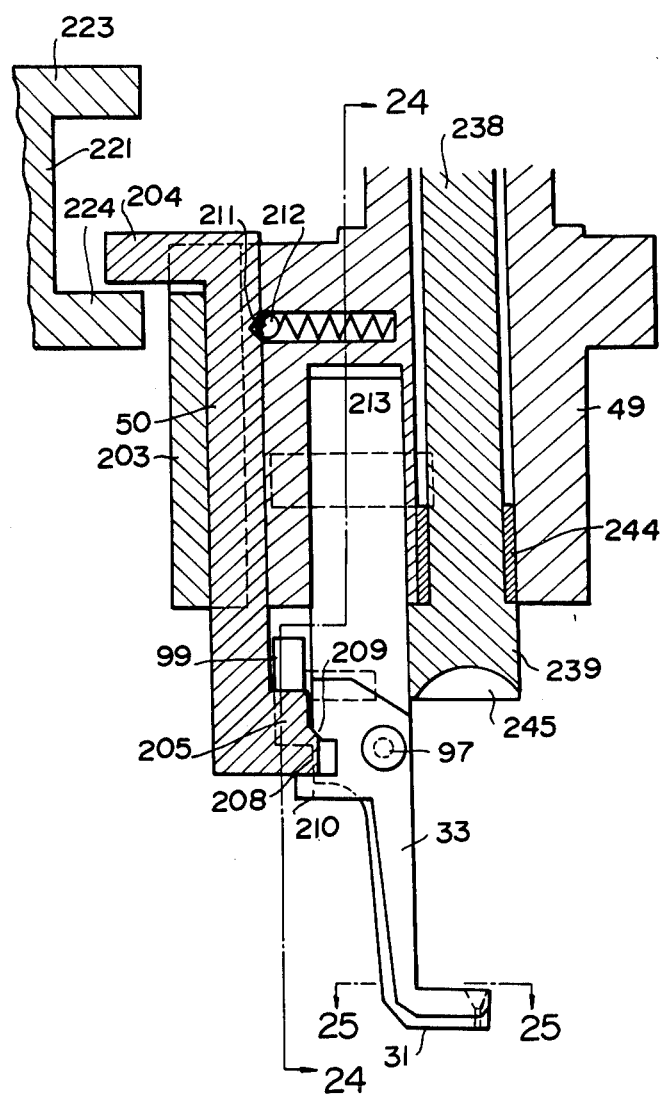
FIG. 23 is a sectional view of the lead holding and guiding sub-assembly taken along Line 23-23 of FIG. 20.
Figure 24:
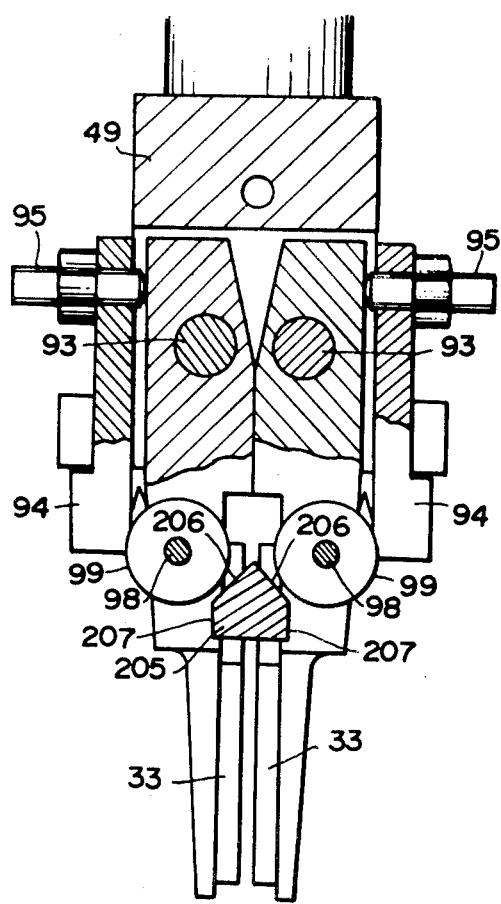
FIG. 24 is a sectional view of the lead holding and guiding sub-assembly taken along Line 24—24 of FIG. 23.

Referring now to FIG. 23, a collar 203 formed with a guiding groove therein is mounted on a surface of block 49 and an operation rod 50 is slideably secured in this guiding groove so that rod 50 may be displaced in the vertical direction. Operation rod 50 is formed with an upper horizontal portion forming an L-shaped lever 204 and a lower L-shaped horizontal portion 205. Lower portion 205 is formed with inclined surfaces 206 and side surfaces 207, as shown in FIG. 24. Lower horizontal portion 205 is formed further with a projection 208 which engages with a projection 209 and 210 formed in inner holding and guiding members 33 so as to define a locked position for inner holding and guiding members 33 and to displace inner holding and guiding members 33 at the appropriate time. Operation rod 50 is also formed with a click-stop mechanism in its upper portion including a click-stop hole 211 to cooperate with a ball 212 and a spring 213 mounted in a depression formed in block 49.

Referring now to FIG. 14, the mechanism for opening and closing inner holding and guiding members 33 and outer holding and guiding members 31 will be described. Inner and outer holding and guiding members 33 and 31 are displaced by movement of upper slider sub-assembly 24 in the following manner. A roller 216 mounted rotatably on a link 215 mouned rotatably to frame 23 by a pin 214. When upper slider sub-assembly 24 is lowered, an inclined face 217 of opening and closing cam 34 abuts roller 216 at the lowest point of the vertical movement of upper slider sub-assembly 24 and link 215 pivots in the clockwise direction about the axis of pin 214. A rod 218 rotatably connected to link 215 is connected pivotally to a lever 219 rotatably mounted to frame 23. The other end of lever 219 is linked pivotally to a striker by a link 220. Striker 221 can slide vertically about a guide 222 as shown in FIG. 15. Striker 221 includes an upper striker portion 223 and a lower striker portion 224, as shown in FIG. 23.

Figure 28:
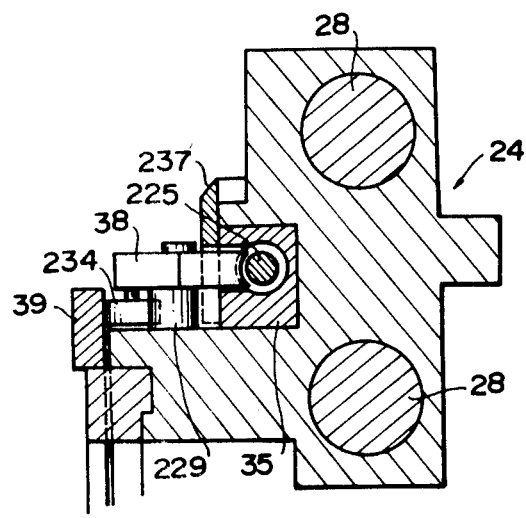
FIG. 28 is a sectional view of a portion of an upper push bar of the upper slider sub-assembly taken along Line 28-28 of FIG. 17.
Figure 29:
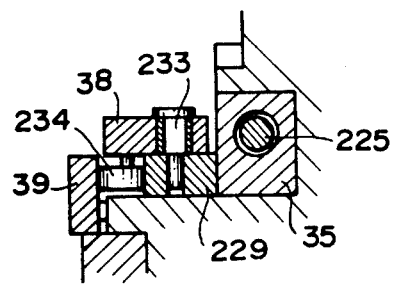
FIG. 29 is a sectional view taken along Line 29-29 of FIG. 17.
Figure 30:
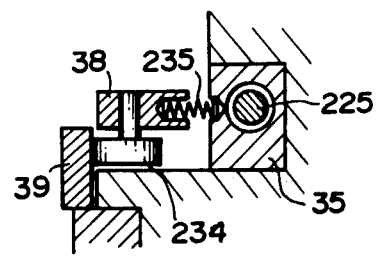
FIG. 30 is a sectional view taken along Line 30—30 of FIG. 17.

Push bar sub-assembly 26, shown in FIG. 17, includes an upper push bar sub-assembly and a lower push bar sub-assembly. The upper push bar sub-assembly includes sleeve 35 slideably supported on upper slider sub-assembly 24, an upper push bar 225 slideably mounted in sleeve 35 by means of a bearing, a stop plate 226 secured to the top of sleeve 35 and a coupling 227 mounted at the lower end of upper push bar 225. A spring 228 mounted about upper push bar 225 for providing a downward biasing force to coupling 227 is positioned between sleeve 35 and coupling 227. A clamp 38 pivotally secured by a pin 223 and a bearing 229 is attached to sleeve 35. Clamp 38 has a roller 234 rotatably mounted on its upper portion and a spring 235 positioned in a groove in clamp 38 and a groove formed in the upper portion of sleeve 35 for clamping and releasing a threaded portion 236 of upper push bar 225. This specific arrangement and the surrounding elements are illustrated in cross-section in FIGS. 28, 29 and 30. Vertical movement of sleeve 35 is guided by a press 237 mounted to upper slider sub-assembly 24, as illustrated in FIG. 28.

Referring now to FIGS. 18 and 23, the lower push bar sub-assembly includes a lower push bar 238 formed with a pressing head 239 at its lower extremity. A flange 240 inserted in a groove formed along the inside surface of coupling 227 supports lower push bar 238 which has two stop plates 241 and 242 secured to the top thereof by a screw 243. Lower push bar 238 is supported slideably in block 49 by a bearing 244 so it may slide vertically in block 49. A concave depression is formed in pressing head 239 so it may be brought into registration with electronic element 64 of electronic component 17 when held in holding and guiding sub-assembly 21. Lower push bar 238 rotates in cooperation with rotary sleeve 248, which rotation is released by coupling 227 and is not transmitted to upper push bar 225.

Referring now to FIGS. 16 and 17, the mechanism for displacing push bar sub-assembly 26 in the vertical direction will now be described. Sleeve cam 36 secured to upper slider sub-assembly 24 is formed with a lower vertical flat surface 246, an inclined surface 247, an upper flat surface 248 and upper inclined surfaces 249 and 250, respectively, from the lower end of sleeve cam 36. A roller 251 to follow the surfaces of sleeve cam 36 is mounted on the upper arm of bell crank 254 pivotally supported by a pin 253 to a bearing 252 which is secured to frame 23. The lower arm of bell crank 254 is formed with a U-shaped groove 255 in which is engaged a pin 256 mounted on sleeve 35 so that sleeve 35 is displaced vertically in cooperation with movement of roller 251 along the surfaces of sleeve cam 36. When the elements are in the position shown in FIG. 17, roller 234 of clamp 38 is engaged with cam clamp 39 and the upper end of clamp 38 is disengaged from threaded portion 236 of upper push bar 225. Accordingly, movement of bell crank 254 is transmitted to coupling 227 by biasing action of spring 228. However, relative movement between upper slider sub-assembly 24 and sleeve 35 results only when cam clamp 39 which is attached to upper slider assembly 24 separates from roller 234. Clamp 38 abuts upper push bar 225 and movement of bell crank 254 is transmitted integrally to coupling 227 directly without biasing spring 228. As flange 240 which is integrated with coupling 227 is not attached to stop plate 241, upper push bar 225 and lower push bar 238 may move relative with respect to each other up to a distance corresponding to the clearance between the upper end of screw 243 and coupling 227. Movement of bell crank 254 is stopped by a limit switch before roller 251 arrives at the lowest point of travel along inclined surface 253. The exact position for stopping bell crank 254 is determined by the distance electronic component 17 is inserted into substrate 19.

As shown in FIG. 16, chuck cam 37 mounted on upper slider sub-assembly 24 is formed with a lower vertical surface 257, an lower inclined surface 258, an upper inclined surface 259 and an upper vertical surface 260, respectively, from the lower end and is positioned to permit movement thereon by a roller 261. Roller 261 is mounted rotatably on a lever 263 rotatably supported on frame 23 by a pin 262. When roller 261 travels on surface 258 of chuck cam 37, lever 263 pivots about pin 262 and is displaced in the counterclockwise direction causing a striker 264 mounted on the lower end of lever 263 to abut roller 73 of chuck 15 thereby opening movable claw 52 and fixed claw 67. This movement releases electronic component 17 from chuck 15 which is then displaced by rotation of rotary chuck holder 14. Operation of the inserting machine having the improved insert assembly constructed and arranged in accordance with the invention will now be described. Referring to FIG. 16, electronic component 17 is shown gripped by movable claw 52 and fixed claw 67 of chuck 15 has been brought to a release position by movement of rotary disc 14 of transfer assembly 9. In response to a signal from the NC program cylinder 27 is actuated to lower upper slider sub-assembly 24 at a constant speed. During this downward movement, the respective members perform the following function by action of the various cams mounted on upper slider sub-assembly 24.

Initially, roller 251 travels on inclined surface 247 of sleeve cam 86 and sleeve 35 is lowered as bellcrank 254 pivots about pin 253. The angle of inclined surface 247 is predetermined so that sleeve 35 travels at the same speed as upper slider sub-assembly 24. There is no relative movement between clamp cam 39 and roller 234 and clamp 38 remains in the position shown in FIG. 17 and no clamping of upper push bar 225 occurs. As bell crank 254 pushes sleeve 35 downwardly, upper push bar 225 and stop plate 226 are lowered by the gripping action of sleeve 35 thereby lowering spring 228 together with sleeve 35. Lower push bar 238 which is suspended from flange 240 through stop plate 241 is lowered by gravity and the downward movement of upper push bar 225.

Lower slider sub-assembly 25 moves upwardly by action of roller 55, bell crank 54 and connection rod 58 as roller 55 engages convex surface 58 of lower slider cam 29. Outer holding and guiding members 31 and inner holding and guiding members 33 move upwardly in response to movement of bell crank 54. Leads 53 of electronic component 17 are guided into guide grooves 101 and 201 and are held therein and gripped between holding grooves 100 and flat surfaces 202.

At the same time, sleeve 35 is displaced downwardly further and push head 239 of lower push bar 238 buts the top of electronic element 64 of electronic component 17. As bell crank 254 is rotated to lower sleeve 35 lower push bar 238 is not lowered further as it abuts the top of electronic component 17. However, when coupling 227 is lowered until it abuts with screw 243, sleeve 35 pushes down on lower push bar 238 by action of spring 228. When sleeve 235 is lowered further, spring 228 compresses and a biasing force corresponding to this compression is imposed on the top of electronic component 17. As sleeve 35 is lowered further, roller 251 arrives at flat surface 248 and movement of sleeve 35 stops.

Upper slider sub-assembly 24 continues its downward movement thereby separating cam clamp 39 from roller 234 and clamp 38 clamps upper push bar 225 due to the biasing force of spring 235. Accordingly, movement of sleeve 35 is integrated with upper push bar 225 and spring 228 is maintained in a compressed state with the internal biasing force on electronic component 17 gripped between movable claw 52 and fixed claw 67 of chuck 15 and press head 239.

Even if the type of electronic component 17 to be inserted in altered and the insertion height is changed, the advantages of this type of insert assembly are clearly apparent. The position of vertical surface 248 of sleeve cam 36, which determines the stopping position of sleeve 35, need not be changed, even though a taller electronic component falls into contact with push head 239 at an earlier position. This causes spring 228 to yield to a larger extent and exert a larger biasing force. On the other hand, a spring 228 having a lower compression strength may be chosen. It is possible to select an appropriate spring force for any type of electronic component and thereby avoid damage to the component irrespective of the type of component to be inserted. The exact position of vertical surface 248 is selected so that when an electronic component having the shorter height is selected, the downward movement of sleeve 35 is stopped after slight yielding of spring 228.

Substantially simultaneous with the above downward movement of upper slider sub-assembly 24, lever 263 is displaced in the counterclockwise direction by travel of roller 261 along inclined surface 258 of chuck cam 37. As lever 263 is displaced, striker 264 abuts roller 73 thereby opening movable claw 52 and fixed claw 67. At the same time, the biasing force imposed on electronic component 17 by a spring 228 is released which returns to its unbiased position. Chuck 15 is retracted downwardly and electronic component 17 is delivered to the insert position gripped by outer and inner holding and guiding members 31 and 33. Striker 264 returns to its original position by action of roller 261 travelling along inclined surface 259 of chuck cam 237. This immediate return is required so that there is clearance between striker 264 and roller 73 when rotary chuck holder 14 is rotated.

After striker 264 is retracted downwardly to a point that it does not impinge lead holding and guiding sub-assembly 21, lead holding and guiding sub-assembly rotating cam 43 engages roller 79 and rotates lead holding and guiding sub-assembly 21 through rack 89 and pinion 91, as shown in FIG. 18. This rotation is accelerated and controlled by spring 88 acting as the dead point mechanism.

As sleeve 35 is lowered further, lower slider sub-assembly 25 is also lowered due to travel of roller 251 along upper inclined surface 249 of sleeve cam 36. As roller 216 travels along inclined surface 60 of lower slider cam 29 push head 239 and outer and inner holding and guiding members 31 and 33 contacting printed circuit board 19, lower slider sub-assembly 25 abuts stopper 92 and its downward movement ceases. At this point, roller 55 has not reached vertical surface 61 of lower slider cam 29 and a certain clearance is maintained. When lower slider sub-assembly 25 abuts stopper 92 there is a natural tendency to spring up, however, it is prevented from doing so by lower slider cam 30.

As sleeve 35 is lowered further, electronic component 17 is pressed by push head 239 and slides between holding groove 100 and flat surface 202. As a result thereof, the ends of leads 53 are inserted into openings 19' of printed circuit board 19. As push head 239 continues to push on electronic component 17, leads 53 are pushed further down and they are bent into the configuration shown in FIG. 6 to form a stopper portion 265. At the point where stopper portion 265 abuts printed circuit board 19 and by action of a limit switch, the movement of bell crank 254 stops the downward movement of push head 239. Excess portions of leads 53 are cut and the bending of the cut end portions are performed from the back surface of printed circuit board 19 by the cutting and bending mechanism (not shown). Leads 53 of electronic component 17 are now secured to printed circuit board 19 as illustrated in FIG. 7.

Figure 31:
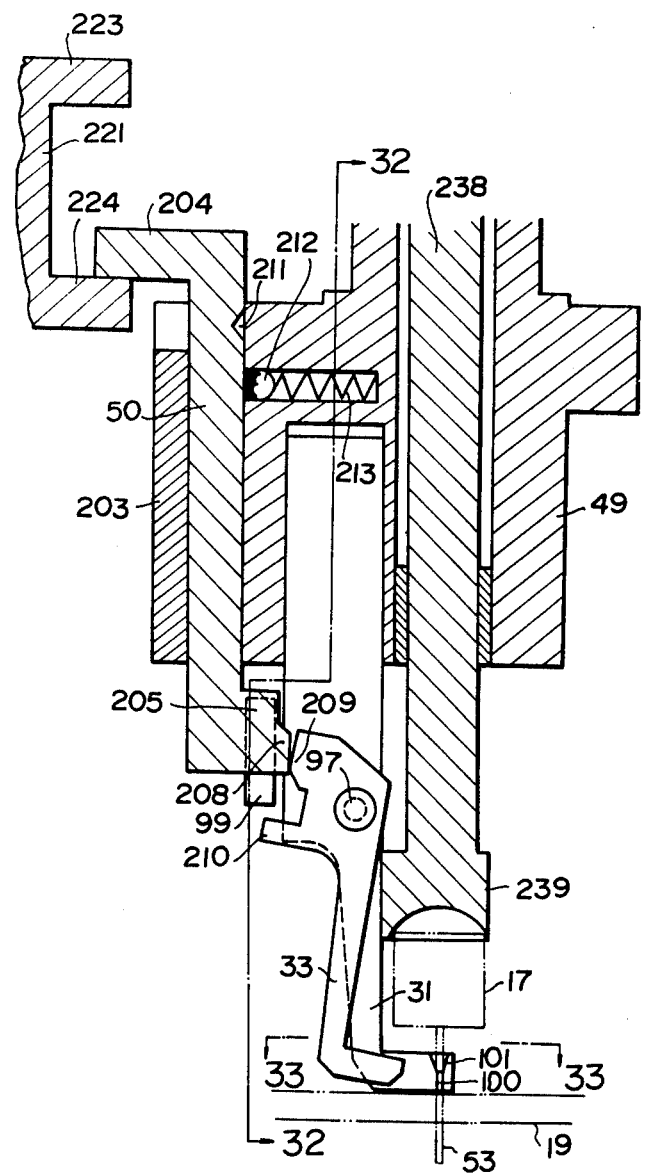
FIG. 31 is a sectional view illustrating the position of the lead holding and guiding sub-assembly being displaced from the inserted electronic component and taken along Line 31—31 in FIG. 32.
Figure 32:
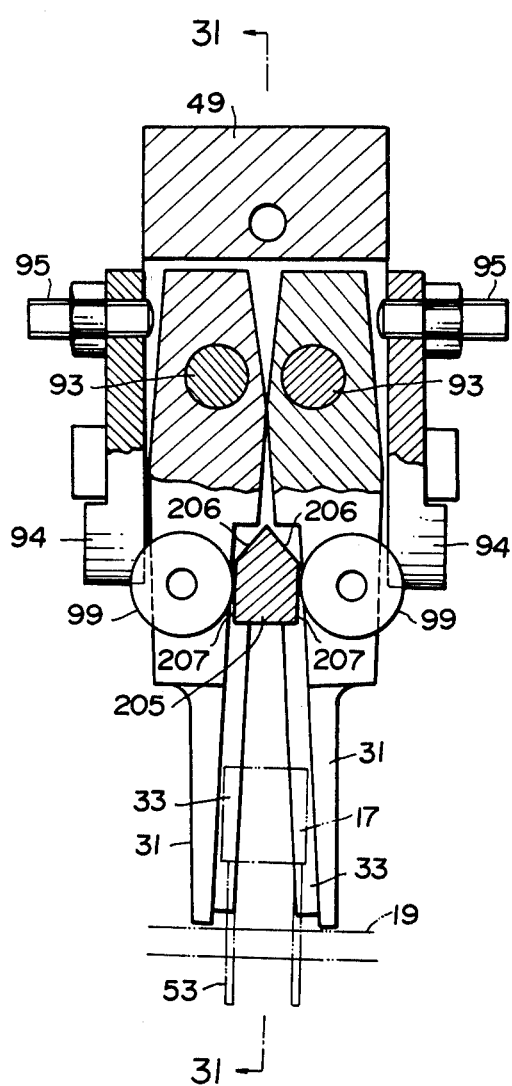
FIG. 32 is a sectional view taken along Line 32—32 in FIG. 31.

When leads 53 are inserted into openings 19' of printed circuit board 19, roller 216 travels along inclined surface 217 of opening and closing cam 34 causing striker 221 to move upwardly. As shown in FIG. 31, lever portion 204 of operation rod 50 is lifted up by lower striker 224 of striker 221. Accordingly, projection 208 abuts projection 209 of operation rod 50 thereby rotating inner holding and guiding member 33 about pin 97 and the holding portion of inner holding and guiding member 33 is retracted in the y direction thereby opening the inside of holding groove 100. Initially, there is a small clearance between inclined portions 205 of operation rod 50 and rollers 99, as shown in FIG. 24. However, when operation rod 50 is lifted further and inclined surfaces 206 abut rollers 99 after displacement of inner holding and guiding members 33 in the y direction, outer holding and guiding members 31 are opened when side surfaces 207, contact rollers 99 as illustrated in FIG. 32. If lead holding and guiding sub-assembly 21 is retracted at this point, it is possible to insert electronic component 17 smoothly without any contact with the elements of holding and guiding sub-assembly 21.

Figure 33:
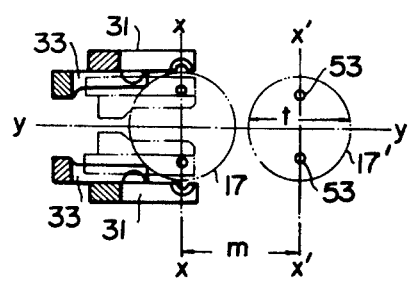
FIG. 33 is a sectional view of the lead holding and guiding sub-assembly taken along Line 33—33 of FIG. 31.
Figure 34:
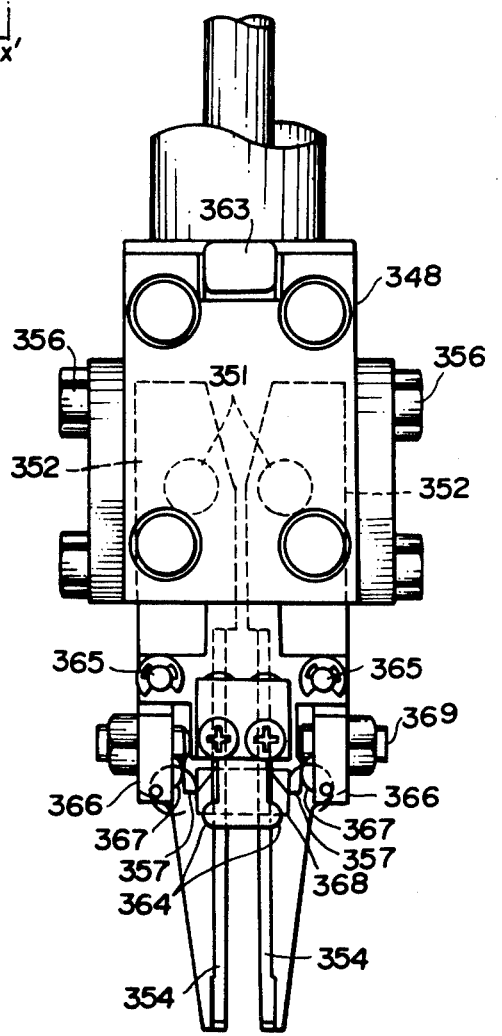
FIG. 34 is a side elevational view of a lead holding and guiding sub-assembly of an insert assembly constructed in accordance with another embodiment of the invention.
Figure 35:
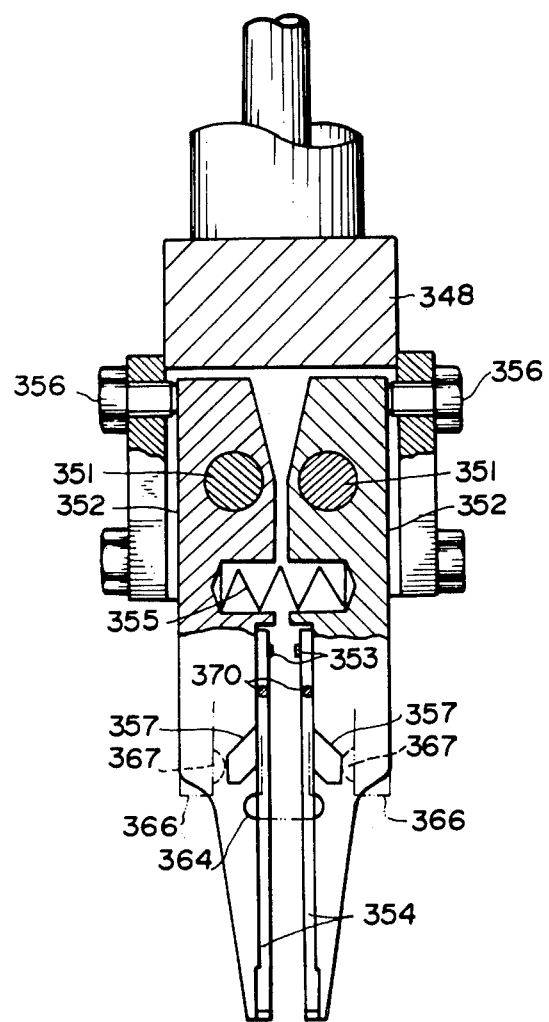
FIG. 35 is a sectional view of the lead holding and guiding sub-assembly of the insert assembly illustrated in FIG. 34.

The position of outer and inner holding and guiding members 31 and 33 at this time is illustrated in FIG. 33. Inner holding and guiding members 33 are first moved in the y direction and then they are opened in the x direction together with outer holding and guiding members 31. This results in sufficient clearance about electronic component 17 to retract holding and guiding sub-assembly 21. A previously inserted electronic component 17' is shown in FIG. 33 adjacent to electronic component 17 just inserted. As shown in the figure, all the holding and guiding members are retracted in the y direction to the left of the x axis. Accordingly, even if the distance m between electronic component 17 and adjacent previously inserted electronic component 17' is small, the thickness t of the electronic component can be increased to a maximum, only limited by the distance necessary to prevent electronic components 17 and 17' from contacting each other. Therefore, by utilizing an improved insert assembly constructed and arranged in accordance with the invention, not only flat electronic components such as ceramic condensers, but also cylindrical and prismatic electronic elements can be inserted by the automatic inserting machine of the invention. Thus, varous electronic components such as chemical condensers, Mylar condensers, peaking coils and resistors can be inserted conveniently and automatically into printed circuit board substrates.

Referring now to FIG. 6, if the height $h_1$ from the end of lead 53 to the lower end of stopper portion 265 is maintained constant, the stroke required to insert lead 53 into substrate 19 is not altered. Accordingly, when various electronic components differing in height $h_2$ from the lower end of stopper portion 265 to the top of element 64 are inserted, only a small biasing force imposed by soft spring 228 is changed, and the insertion operation is not influenced by the force of spring 228 and electronic components differing in height $h_2$ may be inserted by the same force. Furthermore, since insertion of lead 53 is stopped by limit switch at the point where the lower end of stopper 265 abuts printed circuit board 19, no greater force is imposed on electronic component 17 and it is prevented from being damaged. Moreover, when various electronic components differing in size are inserted, adjustments need not be made for the respective electronic components inserted. Therefore, automatic insertion of various types of electronic components can be accomplished easily.

Referring now to FIGS. 34–37, an alternative embodiment of the lead holding and guiding sub-assembly and push bar assembly will be described. A lead holding and guiding sub-assembly 350 includes two outer holding and guiding members 352 pivoted by pins 351 on a block 348. Two inner holding and guiding members 354 are secured by pins 353 to the inner face of outer holding and guiding members 352. A compression spring 355 is positioned in an indentation formed in the upper portion of each outer holding and guiding member 352 thereby biasing against each other so that the holding ends remain opened. The degree of opening between outer holding and guiding members 352 may be adjusted by a stopper hold 356 mounted on the side of a block 348. An opening and closing cam 357 is mounted on each other holding and guiding member 352 for opening and closing outer holding and guiding member 352.

Figure 38:
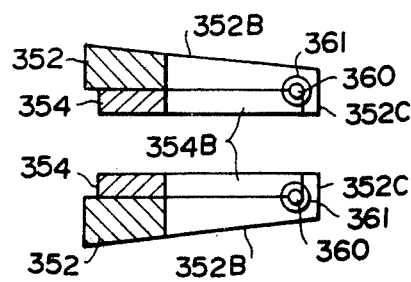
FIG. 38 is a sectional view taken along Line 38—38 of FIG. 36.
Figure 41:
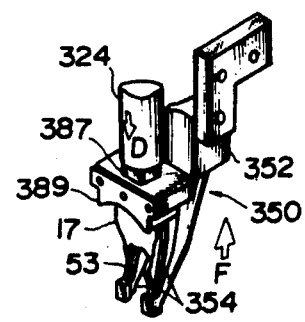
FIGS. 41-45 are perspective views illustrating the sequence of operation of the lead holding and guiding sub-assembly in accordance with the embodiment depicted in FIG. 34.
Figure 39:
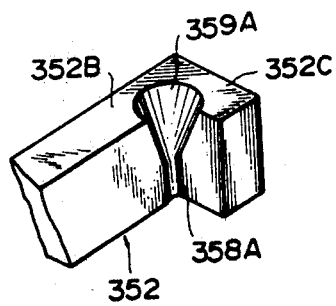
FIG. 39 is a perspective view of a portion of an outer holding and guiding member of the lead holding and guiding sub-assembly illustrated in FIG. 34.
Figure 40:
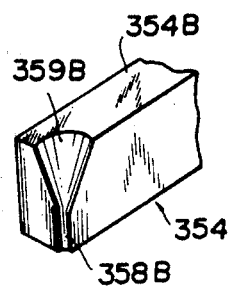
FIG. 40 is a perspective view of a portion of an inner holding and guiding member of the lead holding and guiding sub-assembly illustrated in FIG. 34.

Each outer and inner holding and guiding members 352 and 354 is formed with a vertical portion 352A and 354A, respectively, extending substantially in the vertical direction, and an inclined portion 352B and 354B, respectively, extending obliquely from vertical portions 352A and 354A at about a 45° angle. Each outer holding and guiding member 352 is formed with an L-shaped bend portion 352C formed at the outermost end of inclined portion 352B as shown in FIGS. 38 and 39. L-shaped portion 352C is formed with a holding groove 358A through the lower surface and a guiding groove 359A extending from the upper surface thereof to holding groove 358A. As shown in FIG. 40, a holding groove 358B and a guiding groove 359B are formed on the corner of inclined portion 354B of each inner holding and guiding member 354 so that the top end face of inclined portion 354B falls into contact with the L-shaped portion 352C. Both grooves 358A and 358B cooperate to form a gripping hole 360 and guiding grooves 359A and 359B cooperate to form a guiding face 361. Leads 53 of electronic component 17 received from chuck mechanism 15 are received by guiding face 361 and held by gripping hole 360 as depicted in FIG. 16.

Referring now to FIGS. 34–37, as operation rod 362 is mounted slideably on block 348 so that it may be displaced in the vertical direction. An L-shaped engaging portion 363 is formed on the top portion of operation rod 362 and a spherical projection 364 is formed in the lower portion of operation rod 362. Spherical projection 364 is adapted to contact the inner faces of each opening and closing cam 357 for outer holding and guiding members 352 for opening outer holding and guiding members 352. A press 366 is provided for each outer holding and guiding member 352 and mounted on both sides of operation rod 362 through pins 365. A spherical projection 367 is formed on the inner face of each press 366 for contacting with the outer face of opening and closing cams 357. An elongating spring 368 is positioned between both presses 366 of outer holding and guiding members 352. Elongating spring 368 is selected so that its biasing force is greater than the elastic force of compression spring 355 positioned between outer holding and guiding members 352, thereby permitting spherical projection 367 to be maintained in contact with the outer faces of opening and closing cams 357 to keep guiding members 352 closed.

Adjustment bolts 369 are provided on presses 366 for adjusting the pressing degree of each outer holding and guiding member 352. Two spring pins 370 are provided on operation rod 362 engaging inner holding and guiding members 354 to bias them in the closing direction. Springs 370 also permit inner holding and guiding members 354 to cooperate with the vertical displacement of operation rod 362. A click-stop mechanism comprising a ball 371 and a spring 372 housed in a depression in block 348 defines a vertical position of operation rod 362 in block 348 by means of projections formed in the matching face of operation rod 362.

Figure 37:
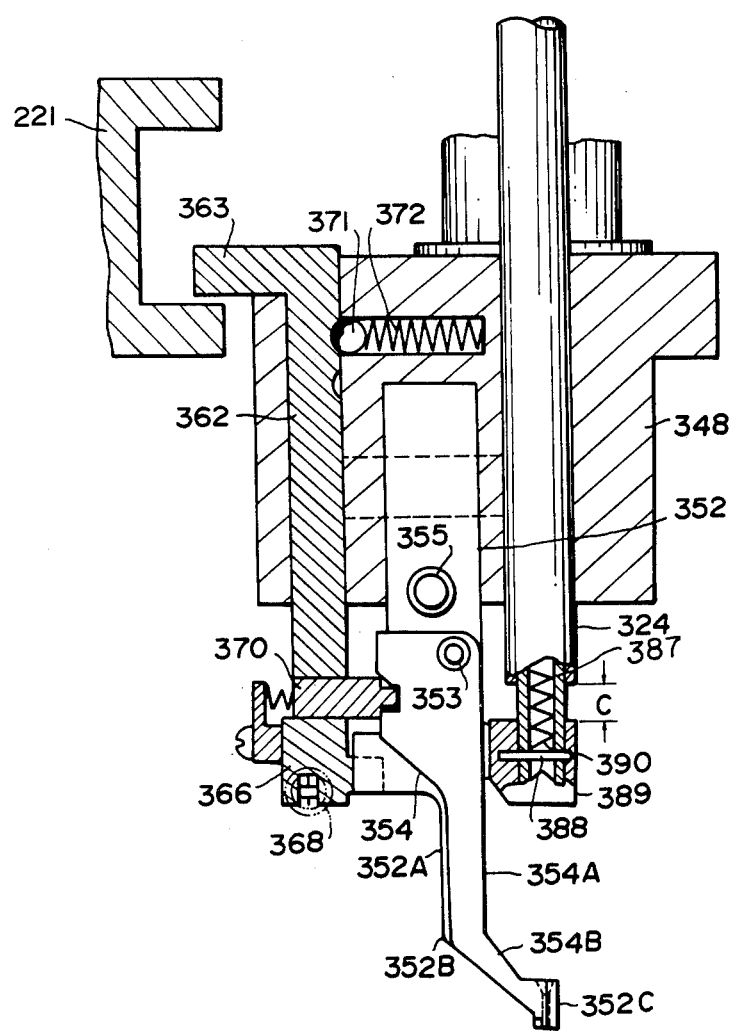
FIG. 37 is a sectional view of the lead holding and guiding sub-assembly depicted in FIG. 34.

As illustrated in the first embodiment shown in FIGS. 14, 16 and 18 and as shown in FIG. 37 with respect to this embodiment, striker 221 is mounted slideably on frame 23 for vertical movement adapted to actuate operation rod 362. Opening and closing cam 34 mounted on upper slider sub-assembly 24 and link 215 having on one end thereof roller 216 is in contact with opening and closing cam 34 also mounted on frame 23. The other end of link 215 is connected pivotally to one end of lever 219 pivoted on frame 23 through rod 218. The other end of lever 219 is connected pivotally by link 220 to striker 221. By means of this mechanical linkage, when upper slider sub-assembly 24 is positioned at its uppermost position, striker 221 is located at its lowest position, and conversely when upper slider sub-assembly 24 is lowered and roller 216 travels along inclined surface 217 of opening and closing cam 234, striker 221 moves upwardly to raise an L-shaped engaging portion 363 formed in operation rod 362.

Figure 36:
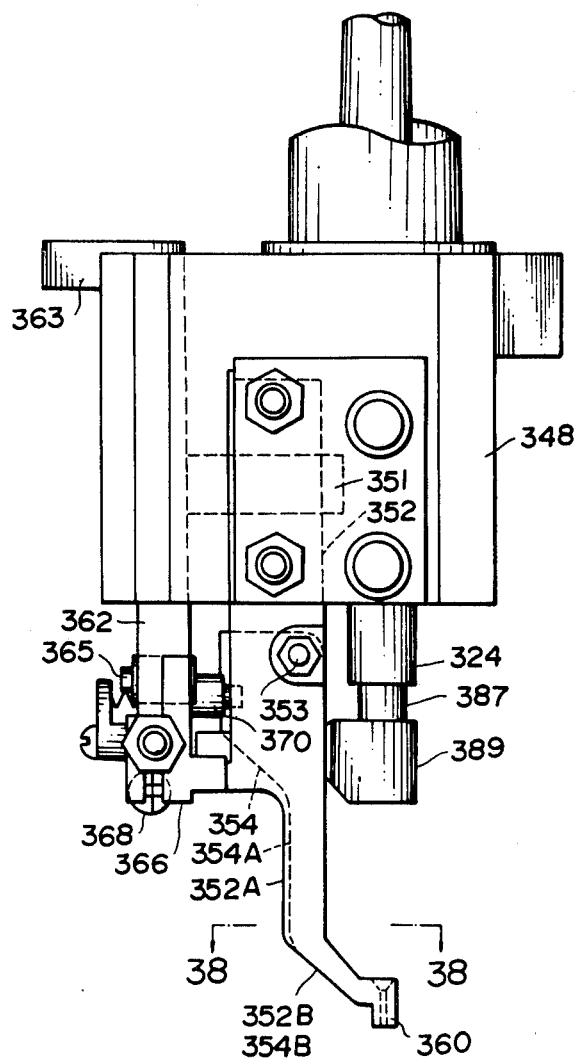
FIG. 36 is a side elevational view of the lead holding and guiding sub-assembly illustrted in FIG. 34.

Referring now to FIGS. 36 and 37, a lower push bar 325 is mounted slideably in block 348 and a push bar sleeve 387 is inserted slideably into the lower end of lower push bar 324. A sleeve cover 389 is mounted to push bar sleeve 387 by a pin 388. A compression spring 390 biasing against pin 388 is positioned in push bar sleeve 387 to bias push bar sleeve in the downward direction which may be displaced a distance indicated as C. Based on this arrangement, lower push bar 324 may be displaced downwardly until sleeve cover 389 falls into contact with the top end of lead holding and guiding sub-assembly 350. Accordingly, by utilizing a lead holding and guiding sub-assembly 350 in this embodiment it is possible to insert electronic components 17 into substrate 19 irrespective of size of the electronic component.

As described for the initial embodiment, lead holding and guiding sub-assembly 350 may be arranged so that it rotates together with block 348 about lower push bar 324 as the axis of rotation so as to permit changover of inserting direction.

The operation of this embodiment will now be described by reference to FIGS. 14, 16, 17, 18, 41 and 45. As the cylinder 27 is actuated and upper slider sub-assembly 24 is lowered, bell crank 254 pivots counterclockwise in response to travel of roller 251 on inclined face 247 of sleeve cam 36. Sleeve 35 is also lowered, lowering lower push bar 324 as indicated by an arrow D in FIG. 41 in response to the force of spring 228 and coupling 227. Roller 55 in contact with lower slider cam 29 separates from vertical surface 57 of lower slider cam 29 and bell crank 54 is rotated slightly about pin 51 in the clockwise direction. In response to lower slider sub-assembly 25 moves upwardly with lead holding and guiding assembly 350 as indicated by an arrow F. Accordingly, the electronic component 17 held by chuck 15 is pressed by sleeve cover 389 and leads 53 of electronic component 17 are guided in and held by gripping holes 360 between outer holding and guiding members 352 and inner holding and guiding members 354. During the foregoing inserting operation, due to buffer actions of springs 228 and 390, electronic component 17 is prevented from being damaged and insertion of the electronic component 17 into holding and guiding sub-assembly 350 is accomplished by an appropriate pressing force.

Figure 42:
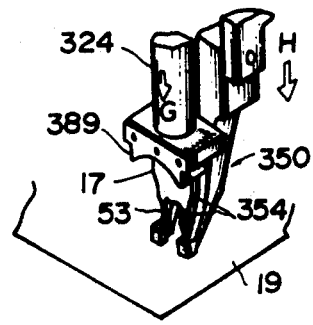

When upper slider sub-assembly 24 is lowered further, bell crank 254 pivots in the counterclockwise direction in response to roller 251 travelling on inclined surface 249 of sleeve cam 36 and sleeve 35 is lowered. At this point, upper push bar 225 is clamped by the clamp 38, and the movement of the sleeve 35 is transmitted to the lower push bar 324 through the upper push bar 225 and coupling 227. Simultaneously, bell crank 54 pivots counterclockwise when roller 216 travels along inclined surface 60 of lower slider cam 29 to lower slider sub-assembly 25. Inclined surface 249 of sleeve cam 36 and inclined surface of lower slider cam 29 are arranged so that the descending speed of sleeve 35 equals to the descending speed of lower slider sub-assembly 25. Both lower push bar 324 and lead holding and guiding assembly 350 are lowered as indicated by arrows G and H in FIG. 42, and leads 53 of the electronic component 17 are inserted into the printed circuit board 19.

Figure 43:
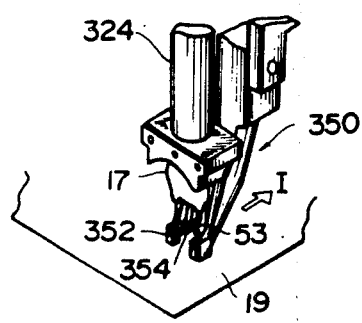

Link 215 pivots in the clockwise direction and lifts striker 221 in response to travel of roller 216 on opening and closing cam 34. At this moment, operation rod 362 mounted on block 348 is raised and inner holding and guiding members 354 engaged with spring pins 370 pivot as indicated by an arrow I in FIG. 43 to release gripping of leads 53.

Figure 44:
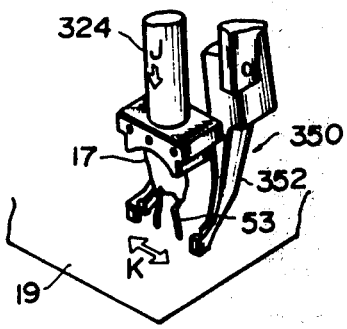

The downward movement of lower push bar 324 is continued for a while as indicated by an arrow J in FIG. 44 even after stopping of lead holding and guiding sub-assembly 350, whereby the leads 53 are inserted to a predetermined depth into printed circuit board 19.

A push bar sleeve 387 inserted in lower push bar 324 mau travel distance C as shown in FIG. 37, the pushing force of lower push bar 324 can be set easily. This case of adjustment permits a variety of types of electronic components differing in shape and size over a wide range to be inserted by this sub-assembly. This is especially true for electronic components having a very small outer shape, such as straight lead ceramic condensers which can be inserted conveniently.

After electronic component 17 has been inserted in printed circuit board 19, spherical projections 364 on the top end of the operation rod 362 abut the inner faces of opening and closing cams 357 of outer holding and guiding members 352. Outer holding and guiding members 352 are opened outwardly as indicated by an arrow K in FIG. 44. When operation rod 362 is raised further, the engagement between outer holding and guiding members 352 and presses 366 is released and elongating spring 368 release outer holding and guiding members 352. Accordingly, outer holding and guiding members 352 are opened further in a direction indicated by an arrow K by the action of compressing spring 355.

Figure 45:
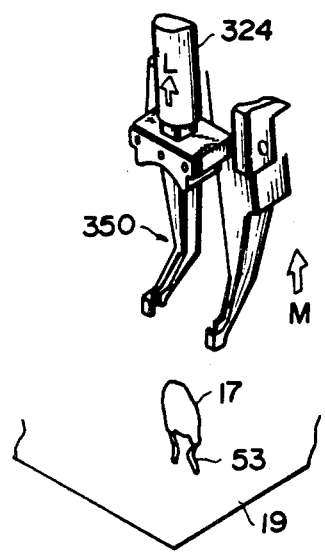

After the foregoing operations, both lower push bar 324 and opened lead holding and guiding assembly 350 are retracted in the vertical direction as indicated by arrows L and M in FIG. 45. At this point in time, a series of operations for inserting electronic component 17 into printed circuit board 19 has been completed.

According to this latter embodiment, the operation of opening outer holding and guiding members 352 in lead holding and guiding sub-assembly 350 is performed in two stages. As the required opening is minimal and is accomplished by a mechanical force of cam means and further opening is accomplished by an elastic force of compression spring 355, even if outer holding and guiding members 352 fall into contact with an adjacent electronic component when opened, they will not damage the adjacent electronic component. Therefore, the distance between two adjacent electronic components can be reduced markably. In addition, even if a coaxial type electronic component has been inserted previously in the vicinity of the inserting position, another electronic component can be inserted conveniently, since the holding ends of outer and inner holding and guiding members 352 and 354 are formed with inclined portions 352B and 354B extending downwardly and obliquely.

Still further, in the above-mentioned embodiment, by virtue of the feature that the push bar sleeve is mounted in the lower push bar and is urged downwardly by the spring, and that the sleeve cover is mounted on the push bar sleeve so that the sleeve cover presses the electronic component, it is possible to insert reliably a variety of electronic components differing in size and shape over a broad range. This results in the advantage that electronic components having a very small outer shape can be inserted reliably.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

We claim:

1. In a machine for processing and inserting parallel lead electronic components into lead receiving openings in a circuit substrate including insert means for receiving an electronic component at a predetermined position and inserting the electronic component into the substrate, the improvement which comprises an insert sub-assembly including,
   (a) a frame;
   (b) driving means moveably mounted on said frame;
   (c) first slider means mounted slideably on said frame for moving in response to movement of said driving means;
   (d) second slider means mounted slideably on said frame for moving in response to movement of said first slider means;
   (e) lead holding and guiding means for holding and guiding said electronic component for moving said component in cooperation with movement of said second slider means; and
   (f) push bar means for displacing said electronic component from said predetermined position to an inserted position under control of said lead holding and guiding means, said push bar means moving in cooperation with movement of said first slider means.

2. The machine of claim 1, wherein said lead holding and guiding means includes two outer holding members for engaging the leads of said electronic component therein at said predetermined position.

3. The machine of claim 2, wherein said lead holding and guiding means further includes two inner holding members for cooperatively holding said component with said outer holding members.

4. The machine of claim 2, wherein said outer holding members are formed with a lower holding groove and an upper conical face guiding groove above said holding groove.

5. The machine of claim 4, wherein said inner holding members are formed with a lower holding flat surface and a conical face guiding groove above said holding flat surface.

6. The machine of claim 2, wherein said outer holding members are formed with an L-shaped portion for holding and guiding said leads of said electronic component.

7. The machine of claim 1, wherein said inner holding members pivot on the inner holding surface of a corresponding outer holding member whereby each said inner holding member contacts the inner surface of said L-shaped portion of said corresponding outer holding member.

8. The machine of claim 1, wherein said push bar means include a sleeve for moving in response to movement of said first slider means, a first push bar slideably supported in said sleeve, a spring biased between said sleeve and said first push bar, a second push bar coupled to an end of said first upper push bar and a clamp means for clamping said upper push bar supported in said sleeve.

9. The machine of claim 1, wherein said lead holding and guiding means rotates about an axis of said frame to effect angular reorientation of said electronic component prior to displacement of said electronic component into said inserted position in said substrate in response to movement of said second slider means.

10. The machine of claim 1, wherein said lead holding and guiding means includes release means for releasing the gripping of said lead holding and guiding means.

11. The machine of claim 2, wherein said lead holding and guiding means includes biasing means for urging and opening said outer holding members, outer holding member-pressing means for defining the degree of opening of said outer holding members, and an operation rod adapted to open said pressing means by a first movement thereof, and said operation rod further adapted to open said lead holding members whereby said lead holding and guiding members are retracted to release said electronic component.

12. The machine of claim 8, wherein said second push bar includes a push bar sleeve slideably inserted in the free end of said second push bar, a spring for urging said push bar sleeve in response to movement of said sleeve for pushing said electronic component into said receiving openings.

* * * * *